United States Patent
Sutton et al.

(10) Patent No.: US 11,953,525 B2
(45) Date of Patent: Apr. 9, 2024

(54) WIRELESS SENSING DEVICE

(71) Applicant: ABB Schweiz AG, Baden (CH)

(72) Inventors: Felix Sutton, Zürich (CH); Yannick Maret, Dättwil (CH); Kai Hencken, Lörrach (DE)

(*) Notice: Subject to any disclaimer, the term of this patent is extended or adjusted under 35 U.S.C. 154(b) by 189 days.

(21) Appl. No.: 17/539,908

(22) Filed: Dec. 1, 2021

(65) Prior Publication Data
US 2022/0170962 A1   Jun. 2, 2022

(30) Foreign Application Priority Data

Dec. 1, 2020   (EP) .................................. 20211013

(51) Int. Cl.
| | |
|---|---|
| *G01R 15/18* | (2006.01) |
| *G01D 11/30* | (2006.01) |
| *G01R 1/18* | (2006.01) |
| *G01R 15/20* | (2006.01) |
| *H02J 50/00* | (2016.01) |

(52) U.S. Cl.
CPC .............. *G01R 15/20* (2013.01); *G01D 11/30* (2013.01); *G01R 1/18* (2013.01); *G01R 15/183* (2013.01); *G01R 15/207* (2013.01); *H02J 50/001* (2020.01)

(58) Field of Classification Search
CPC . G01D 11/30; G01K 1/14; G01R 1/18; G01R 1/20; G01R 15/14; G01R 15/18; G01R 15/183; G01R 15/20; G01R 15/202; G01R 15/207; G01R 19/2513; H02J 50/001
See application file for complete search history.

(56) References Cited

U.S. PATENT DOCUMENTS

| | | | | |
|---|---|---|---|---|
| 4,754,218 A | * | 6/1988 | Wagner ................. | G01R 15/18 324/117 R |
| 6,642,704 B2 | * | 11/2003 | Hastings ................ | G01R 1/22 324/117 R |
| 6,731,105 B1 | * | 5/2004 | Hoyle .................. | G01R 15/207 324/117 R |
| 7,909,508 B2 | * | 3/2011 | Maloney ................ | G01D 11/24 374/208 |
| 9,088,209 B2 | * | 7/2015 | Juds .................... | H02M 3/156 |

(Continued)

OTHER PUBLICATIONS

Extended European Search Report, issued by the European Patent Office, regarding corresponding patent application Serial No. EP20211013.6; dated May 28, 2021; 6 pages.

*Primary Examiner* — Levi Gannon
(74) *Attorney, Agent, or Firm* — Greenberg Traurig, LLP

(57) ABSTRACT

A sensing device for monitoring an electrical component or apparatus is described. The sensing device is attachable to an electrical conductor and includes a sensor for measuring at least one physical property, a wireless communication unit for transmitting measurement data to a receiver, an energy harvesting unit configured to harvest energy from a current flowing through the electrical conductor and comprising an electromagnetic coil wound around a core, and a connection mechanism to make the core connectable to a strap comprising a material having a high magnetic permeability. The sensing device is configured to be operable when no strap is connected to the core and energy is harvested via an open magnetic circuit as well as when a strap is connected to the core and energy is harvested via a closed magnetic circuit.

12 Claims, 2 Drawing Sheets

(56) References Cited

U.S. PATENT DOCUMENTS

| | | | |
|---|---|---|---|
| 2006/0076838 A1 | 4/2006 | Solveson et al. | |
| 2012/0039061 A1* | 2/2012 | McBee | G01R 19/00 |
| | | | 361/825 |
| 2015/0226772 A1* | 8/2015 | Kreikebaum | G01R 21/08 |
| | | | 324/244 |
| 2016/0225520 A1* | 8/2016 | Miron | G01R 15/186 |
| 2018/0211774 A1* | 7/2018 | McCammon | H01F 27/022 |

* cited by examiner

WIRELESS SENSING DEVICE

FIELD OF THE DISCLOSURE

The present disclosure relates to a sensing device for monitoring an electrical component or apparatus. Embodiments relate to a sensing system and to a switchgear apparatus.

TECHNICAL BACKGROUND

Wireless sensing devices can be used for monitoring electrical components or apparatus like switchgear apparatus. The sensing devices may for example provide connectivity or enable proactive maintenance. Due to harsh environmental conditions and high costs associated with a maintenance of battery-operated devices, using an energy harvesting solution for powering wireless sensing devices is beneficial. In particular, energy can be harvested from an alternating magnetic field surrounding an electrical conductor like a busbar. The harvested energy can be used to power the sensing operation and wireless communication of the sensing device. Energy harvesting solutions of typical wireless sensing devices are designed for limited ranges of electrical currents and for specific geometrical configurations. In industrial environments including a plurality of different electrical components or apparatus, use of a variety of different sensing devices can be required. Adaptability and installation efficiency of existing sensing devices may be limited.

It is therefore an object of the present disclosure to overcome at least some of the above-mentioned problems in the prior art at least partially.

SUMMARY OF THE DISCLOSURE

In view of the above, a sensing device for monitoring an electrical component or apparatus is provided. The sensing device is attachable to an electrical conductor and includes a sensor for measuring at least one physical property, a wireless communication unit for transmitting measurement data to a receiver, and an energy harvesting unit configured to harvest energy from a current flowing through the electrical conductor. The energy harvesting unit includes an electromagnetic coil wound around a core. The sensing device further includes a connection mechanism to make the core connectable to a strap including a material having a high magnetic permeability. The sensing device is configured to be operable when no strap is connected to the core and energy is harvested via an open magnetic circuit as well as when a strap is connected to the core and energy is harvested via a closed magnetic circuit.

In embodiments, a sensing system is provided. The sensing system includes a sensing device according to embodiments described herein and a strap. The strap is connectable to the core via the connection mechanism.

In embodiments, a switchgear apparatus is provided. The switchgear apparatus includes a sensing device according to embodiments described herein.

Further advantages, features, aspects and details that can be combined with embodiments described herein are evident from the dependent claims, claim combinations, the description and the drawings.

BRIEF DESCRIPTION OF THE FIGURES

The details will be described in the following with reference to the figures, wherein.

DETAILED DESCRIPTION OF THE FIGURES AND OF EMBODIMENTS

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment can be applied to a corresponding part or aspect in another embodiment as well.

Figure 1:
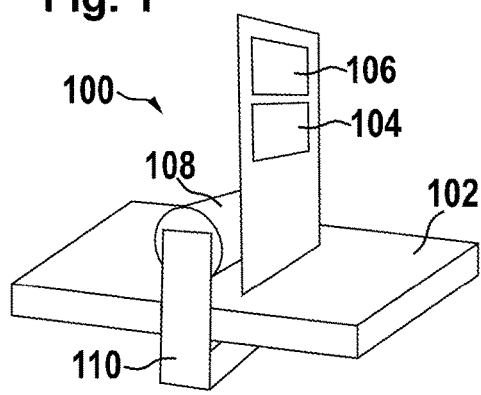
FIG. 1 is a schematic view of a sensing device according to embodiments of the present disclosure.

FIG. 1 is a schematic view of a sensing device according to embodiments of the present disclosure. The sensing device 100 is for monitoring an electrical component or apparatus. The component or apparatus may be for example a switchgear apparatus, a busbar, a busbar joint, a motor, a generator, a motor drive, or a converter. In particular, the sensing device is a wireless sensing device. Wireless monitoring of an electrical component or apparatus can be enabled.

The sensing device 100 is attachable to an electrical conductor 102, particularly a busbar. For example, the sensing device may be attachable to the electrical conductor via a double-sided tape, a glue, or a fastening element like a bolt.

The sensing device 100 includes a sensor 104 for measuring at least one physical property. The physical property may be for example a temperature, a humidity, a gas concentration, a concentration of particulates like dust, a vibrational amplitude, or an electrical current, particularly an electrical current flowing through the electrical conductor 102. The gas concentration may be a concentration of a gas like for example ozone or $CO_2$. In embodiments, the sensing device includes a plurality of sensors. The sensing device may include for example at least 2, 3 or 4 sensors, particularly different sensors.

The sensing device 100 includes a wireless communication unit 106 for transmitting measurement data to a receiver. For example, a plurality of sensing devices according to the present disclosure may communicate with a common receiver. Comprehensive monitoring of electrical components or apparatus can be provided.

The sensing device includes an energy harvesting unit configured to harvest energy from a current, particularly an alternating current, flowing through the electrical conductor 102, more particularly by way of the alternating magnetic field surrounding the electrical conductor. In particular, the energy harvesting unit is configured to harvest energy for powering the sensing device, more particularly for powering the sensor and the wireless communication unit.

The energy harvesting unit includes an electromagnetic coil wound around a core 108. In particular, the core 108 includes a material having a high magnetic permeability. In the context of the present disclosure, a high magnetic permeability is particularly to be understood as a relative permeability higher than for example 10, 50, 300, or 1000 at a magnetic field strength H between 1 and 1000 A/m, for example at magnetic field strength of 10 A/m. More particularly, if the material is a composite, the material's permeability may be understood as an effective permeability, i.e. a permeability of a hypothetical homogeneous material having magnetic characteristic of the composite.

In embodiments, the core includes a ferrite or a high-permeability material like soft iron. The core may include an alloy like for example mu-metal. In particular, mu-metal is a soft ferromagnetic nickel-iron alloy with a high magnetic permeability. The core may include a polymer filled with a material having a high magnetic permeability. In the figures, only the cores of the electromagnetic coils are shown, while the windings have been omitted to enhance clarity.

The core may have a cylindrical shape, as particularly shown in FIG. 1, or for example a flattened or rectangular shape. In embodiments, the core has a rectangular cross-section in a direction perpendicular to a length direction of the core. In the context of the present disclosure, a length direction of a component is particularly to be understood as a main direction of extension of the component. A flattened or particularly a rectangular core can increase an amount of collected magnetic flux, particularly since the electromagnetic coil can be positioned closer to the electrical conductor. An energy harvesting efficiency can be enhanced.

For operation, the sensing device 100 is to be attached to the electrical conductor 102 such that the magnetic axis of the electromagnetic coil wound around the core 108 is perpendicular to the current flow. An enclosure of the sensing device may be provided with markings to aid in correct positioning of the device.

The sensing device 100 includes a connection mechanism to make the core 108 connectable to a strap 110 including, particularly consisting of, a material having a high magnetic permeability. A material having a high magnetic permeability is particularly to be understood as described above with respect to the core. The strap may be releasably connectable to the core. The strap may be a flexible strap. A composite material may be used for the strap. The composite material can be used particularly for the purpose of a reduced magnetic reluctance around the electrical conductor, while providing a desired mechanical property, particularly flexibility, to the strap.

Various examples of possible connection mechanisms according to the present disclosure are illustrated in FIGS. 3*a-f* and described in detail below. Additionally or alternatively, the connection mechanism may include contact surfaces provided on the core for making the strap connectable to the core via an adhesive.

The sensing device is configured to be operable in a first configuration and in a second configuration. In the first configuration, no strap is connected to the core and energy is harvested via an open magnetic circuit. In particular, the sensing device can be limited to high-current applications when no strap is connected to the core. A high current is particularly to be understood as a current higher than for example 100, 350, 500, 650, or 2000 A flowing through the electrical conductor. When the current flowing through the electrical conductor is low, the sensing device may have a reduced performance, like for example a reduced sample rate or a reduced accuracy, in the first configuration.

In the second configuration, a strap is connected to the core and energy is harvested via a closed magnetic circuit. In particular, the strap and the core form a closed loop around the electrical conductor for providing the closed magnetic circuit. A closed magnetic circuit has the advantage that the sensing device can have any of the following properties: a faster start, a start with a lower current, or a better performance. The reason is particularly that at a given conductor current, a larger magnetic flux can be channeled through the core. Accordingly, a higher power may be harvested. The sensing device may be usable for low-current applications when the strap is connected to the core. A low current is particularly to be understood as a current lower than for example 30, 20, 10, or 1 A flowing through the conductor.

The strap is an optional add-on for the sensing device. Using the strap increases an energy harvesting efficiency. Accordingly, the sensing device can be upgraded easily to provide a substantially improved performance in case it is beneficial for the particular use. For example, the sensing device can be beneficial in an industrial environment where a mixture of low current and high current switchgear apparatus are deployed.

In particular, the connection mechanism and the strap are separate and independent from an attachment mechanism for making the sensing device attachable to the electrical conductor.

More particularly, the sensing device can be attached to the electrical conductor and used without connecting a strap to the core.

The connection mechanism can provide a low magnetic resistance between the core and the strap in a connected state. The low magnetic resistance may be enabled for example by any of a large contact area or a tight connection between the strap and the core. An improved energy harvesting efficiency in the connected state can be provided without compromising the often-sufficient energy harvesting efficiency without the strap. The connection mechanism of sensing devices according to the present disclosure can provide a mechanically highly stable connection between the core and the strap.

The strap can be a one-piece component or can include at least two parts. For example, the strap may include L- or J-shaped parts. The parts may be attachable to each other to provide a closed magnetic circuit in conjunction with the core. The parts may be attached to each other for example by at least one fastening element like a bolt.

Figure 2:
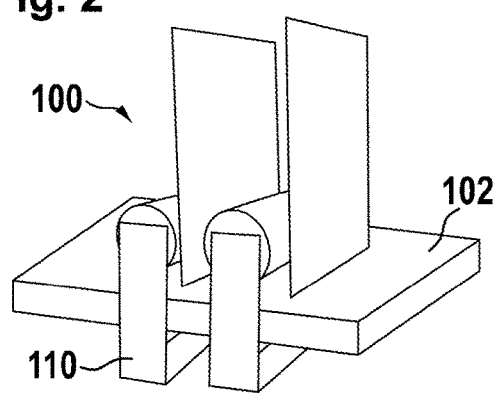
FIG. 2 is a schematic view of a sensing device according to embodiments of the present disclosure.

Sensing devices according to the present disclosure may include two or more electromagnetic coils wound around a respective core. An example of a sensing device 100 including two electromagnetic coils is shown in FIG. 2. In particular, the two electromagnetic coils are wired in series. More particularly, the electromagnetic coils are positioned such that a direction of flux movement is identical for both coils. The cores may for example each be connectable to a separate strap, as shown in FIG. 2, or to a single common strap. The remaining features of the sensing device shown in FIG. 2 may be at least substantially identical to the features described above with regard to FIG. 1.

FIGS. 3*a-f* are schematic, cross-sectional views of sensing devices according to embodiments of the present disclosure, illustrating examples of how a strap may be connected to the core of the energy harvesting unit. With connection mechanisms as described herein, an air gap between the strap and the core may be minimized. In embodiments, a large overlap area between the strap and the core can be provided. A connection having a particularly low magnetic resistance can be achieved.

Figure 3A:
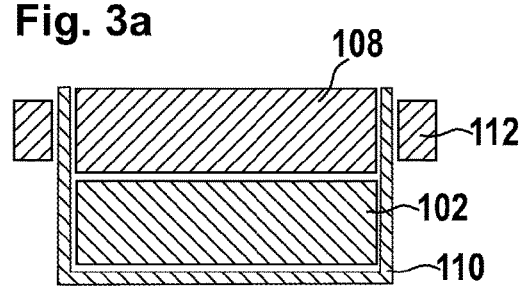
FIGS. 3a-f are schematic, cross-sectional views of sensing devices according to embodiments of the present disclosure.
Figure 3B:
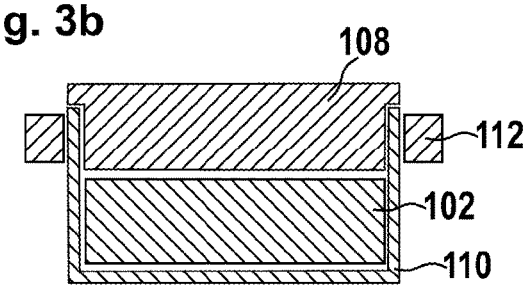

In embodiments, for example as shown in FIG. 3a, the connection mechanism of the sensing device may include a permanent magnet 112 for connecting the strap 110 to the core 108. In particular, the strap 110 is held between the permanent magnet 112 and the core 108 in a connected state. More particularly, the connection mechanism includes a first permanent magnet for attaching the strap to the core from a first side and a second permanent magnet for attaching the strap to the core from a second side. The core 108 may include a recess, as shown for example in FIG. 3b, for providing an offset connection surface. In particular, the connection surface of the core 108 is to be in contact with the strap 110 in a connected state.

Figure 3C:
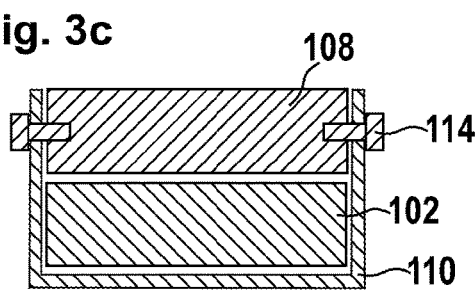

In embodiments, for example as shown in FIG. 3c, the connection mechanism includes a bore, particularly a threaded bore, provided in the core 108. The bore is for connecting the strap 110 to the core 108 via a fastening element 114, particularly via a bolt. In particular, the core 108 includes a first bore fore for connecting the strap to the core from a first side and a second bore for connecting the strap to the core from a second side. Connecting the strap via a fastening element can minimize an air gap between the strap and the core. The fastening elements may include, particularly consist of, a plastic or a metal.

In embodiments, the fastening element 114 includes, particularly consist of, a material having a high magnetic permeability. When the fastening element is screwed into the bore, a low magnetic resistance between the fastening element and the core can be achieved. The fastening element can be in contact with the strap from a second side opposite a side where the strap is in contact with the core. An increased effective contact surface between the strap and the core can be provided. A particularly low magnetic resistance between the strap and the core can be achieved. In embodiments, the fastening element or the fastening elements are included in the connection mechanism.

Figure 3D:
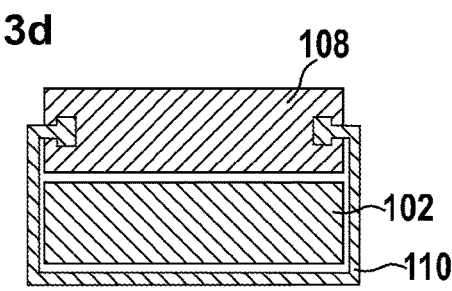

In embodiments, for example as shown in FIG. 3d, the connection mechanism includes a recess provided in the core 108. The recess may be shaped for snap-in attachment of a strap 110 having a correspondingly shaped end section. The end section may have a larger volume than the recess. The volume may be for example more than 3 or 6% larger than the volume of the recess. The volume may be for example less than 15 or 10% larger than the volume of the recess. The strap can be insertable into the recess due to the strap's flexibility. In particular, the strap may undergo an elastic deformation on insertion into the recess. An airgap between the strap and the core can be minimized. A connection between the strap and the core having a particularly low magnetic resistance can be provided.

Figure 3E:
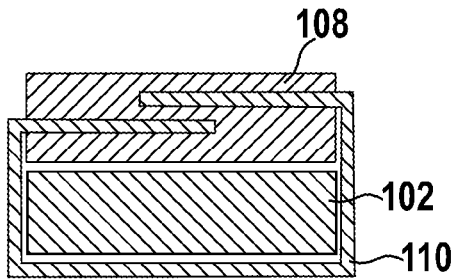

In embodiments, for example as shown in FIG. 3e, the connection mechanism includes a recess provided in the core 108 for inserting an end of the strap 110. A part of the strap to be inserted into the recess may have a larger volume than the recess. The volume may be for example more than 3 or 6% larger than the volume of the recess. The volume may be for example less than 15 or 10% larger than the volume of the recess. Similarly as described above with regard to FIG. 3d, a connection between the strap and the core having a particularly low magnetic resistance can be provided.

In embodiments, the recess extends along more than for example 10, 20, or 40% of a length of the core. For example as shown in FIG. 3e, the recess may extend along more than 50% of a length of the core 108. A large contact area between the strap and the core can be provided. A connection having a particularly low magnetic resistance can be achieved.

Figure 3F:
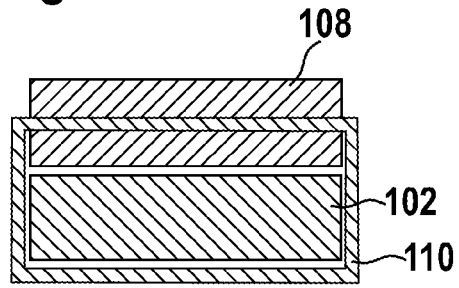

In embodiments, for example as shown in FIG. 3f, the connection mechanism includes a through-hole provided in the core. The through-hole is for passing the strap 110 through the core 108. In particular, the through-hole extends along a length direction of the core 108.

The through-hole may include at least one ridge. For example, the through-hole may include at least 3, 5, or 6 ridges. At the at least one ridge, the diameter of the through-hole is effectively reduced. In particular, the strap may be chosen such that a dimension of the strap is larger than a dimension of the through-hole at the position of the at least one ridge. An air gap between the strap and the core can be minimized, particularly at the position of the at least one ridge.

The connection mechanism of sensing devices according to the present disclosure makes it possible to use straps of different sizes, particularly different lengths, depending on the application. In particular, the strap can be chosen depending on a perimeter of the electrical conductor or a total perimeter of a set of electrical conductors. Generally, the strap can be chosen depending on a geometry of the electrical conductor or set of electrical conductors. For example, the strap may be chosen so as to fit on a set including 2, 3, or more busbars running in parallel. Accordingly, sensing devices according to the present disclosure can be used on electrical conductors or electrical conductor assemblies having varying geometrical configurations.

Figure 4A:
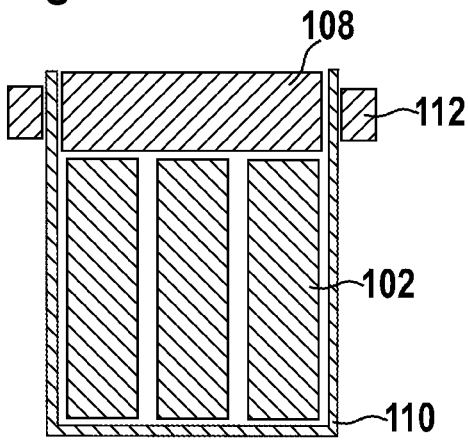
FIGS. 4a-c are schematic cross-sectional views of sensing devices according to embodiments of the present disclosure.
Figure 4B:
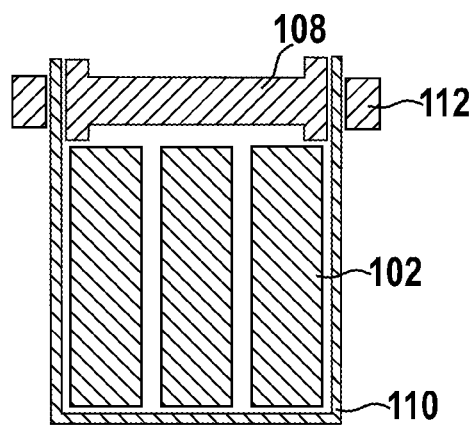
Figure 4C:
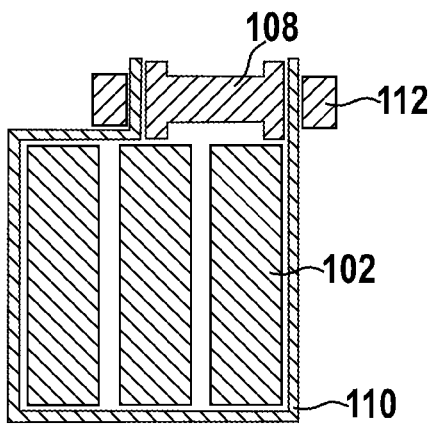

In the examples depicted in FIGS. 4a-c, sensing devices according to the present disclosure are attached to three busbars running in parallel. In the examples, a strap 110 is connected to the core 108 via permanent magnets 112. However, the strap may also be connected to the core via any of the mechanisms described above with regard to FIGS. 3a-3f. Cores 108 of varying lengths can be used. For example, the core 108 can span the full width of the three busbars 102, as shown in FIGS. 4a and 4b, or can be substantially shorter, as shown in FIG. 4c.

The difference can be compensated by using a strap 110 having an appropriate length to provide a closed magnetic circuit. As shown in FIGS. 4b and 4c, the core 108 can be a bobbin, particularly a bobbin including two flanges.

The present disclosure further relates to a sensing system. The sensing system includes a sensing device according embodiments of the present disclosure. The sensing system further includes a strap including a material having a high magnetic permeability as described herein. The strap is connectable to the core of the energy harvesting unit via the connection mechanism. In embodiments, the strap includes any of ferrite or a metal composite.

The present disclosure further relates to a switchgear apparatus. The switchgear apparatus includes a sensing device as described herein. In embodiments, the sensing device is attached to a busbar of the switchgear apparatus.

The present disclosure further relates to a method of monitoring an electrical component or apparatus. The method includes attaching a sensing device as described herein to an electrical conductor of the electrical component or apparatus.

The invention claimed is:

1. A sensing device for monitoring an electrical component or apparatus, the sensing device being attachable to an electrical conductor and comprising:

a sensor for measuring at least one physical property;

a wireless communication unit for transmitting measurement data to a receiver;

an energy harvesting unit configured to harvest energy from a current flowing through the electrical conductor and comprising an electromagnetic coil wound around a core; and a connection mechanism to make the core connectable to a flexible strap, the flexible strap comprising a material having a high magnetic permeability, wherein the connection mechanism further comprises a recess provided in the core for inserting an end of the flexible strap, and wherein a part of the flexible strap to be inserted into the recess has a larger volume than the recess, the sensing device being configured to be operable when no flexible strap is connected to the core and energy is harvested via an open magnetic circuit, as well as when the flexible strap is connected to the core and energy is harvested via a closed magnetic circuit.

2. The sensing device according to claim 1, wherein the connection mechanism comprises a permanent magnet for attaching the flexible strap to the core.

3. The sensing device according to claim 1, wherein the connection mechanism comprises a bore provided in the core for connecting the flexible strap to the core via a fastening element.

4. The sensing device according to claim 1, wherein the recess extends along more than 10% of a length of the core.

5. The sensing device according to claim 1, wherein the recess is shaped for snap-in attachment of the flexible strap having a correspondingly shaped end section.

6. The sensing device according to claim 1, wherein the core has a rectangular cross-section in a direction perpendicular to a length direction of the core.

7. The sensing device according to claim 1, wherein the physical property is a temperature, a humidity, a gas concentration, a vibrational amplitude, or an electrical current.

8. A sensing system, comprising a sensing device for monitoring an electrical component or apparatus, and a flexible strap, the sensing device being attachable to an electrical conductor and comprising:

a sensor for measuring at least one physical property;

a wireless communication unit for transmitting measurement data to a receiver;

an energy harvesting unit configured to harvest energy from a current flowing through the electrical conductor and comprising an electromagnetic coil wound around a core; and a connection mechanism to make the core connectable to the flexible strap, the flexible strap comprising a material having a high magnetic permeability, wherein the connection mechanism comprises a recess provided in the core for inserting an end of the flexible strap, and wherein a part of the flexible strap to be inserted into the recess has a larger volume than the recess, the sensing device being configured to be operable when no flexible strap is connected to the core and energy is harvested via an open magnetic circuit, as well as when the flexible strap is connected to the core and energy is harvested via a closed magnetic circuit.

9. The sensing system according to claim 8, wherein the flexible strap has a relative permeability higher than 10 at a magnetic field strength between 1 and 1000 A/m.

10. A switchgear apparatus, comprising a sensing device for monitoring an electrical component or apparatus, the sensing device being attachable to an electrical conductor and comprising:

a sensor for measuring at least one physical property;

a wireless communication unit for transmitting measurement data to a receiver;

an energy harvesting unit configured to harvest energy from a current flowing through the electrical conductor and comprising an electromagnetic coil wound around a core; and a connection mechanism to make the core connectable to a flexible strap, the flexible strap comprising a material having a high magnetic permeability, wherein the connection mechanism comprises a recess provided in the core for inserting an end of the flexible strap, and wherein a part of the flexible strap to be inserted into the recess has a larger volume than the recess, the sensing device being configured to be operable when no flexible strap is connected to the core and energy is harvested via an open magnetic circuit, as well as when the flexible strap is connected to the core and energy is harvested via a closed magnetic circuit.

11. The switchgear apparatus according to claim 10, wherein the sensing device is attached to a busbar of the switchgear apparatus.

12. A method of monitoring an electrical component or apparatus, the method comprising: attaching a sensing device to an electrical conductor of the electrical component or apparatus, the sensing device comprising:

a sensor for measuring at least one physical property;

a wireless communication unit for transmitting measurement data to a receiver;

an energy harvesting unit configured to harvest energy from a current flowing through the electrical conductor and comprising an electromagnetic coil wound around a core; and a connection mechanism to make the core connectable to a flexible strap, the flexible strap comprising a material having a high magnetic permeability, wherein the connection mechanism comprises a recess provided in the core for inserting an end of the flexible strap, and wherein a part of the flexible strap to be inserted into the recess has a larger volume than the recess, the sensing device being configured to be operable when no flexible strap is connected to the core and energy is harvested via an open magnetic circuit, as well as when the flexible strap is connected to the core and energy is harvested via a closed magnetic circuit.

* * * * *